United States Patent
Yoshida et al.

(10) Patent No.: US 10,529,574 B2
(45) Date of Patent: Jan. 7, 2020

(54) PROCESS OF FORMING ELECTRON DEVICE HAVING GATE ELECTRODE

(71) Applicant: SUMITOMO ELECTRIC INDUSTRIES, LTD., Osaka (JP)

(72) Inventors: Tomohiro Yoshida, Osaka (JP); Hiroyuki Ichikawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/137,078

(22) Filed: Sep. 20, 2018

(65) Prior Publication Data

US 2019/0088483 A1 Mar. 21, 2019

(30) Foreign Application Priority Data

Sep. 21, 2017 (JP) .................. 2017-181482

(51) Int. Cl.
| | |
|---|---|
| *H01L 21/283* | (2006.01) |
| *H01L 21/02* | (2006.01) |
| *H01L 21/311* | (2006.01) |
| *H01L 29/66* | (2006.01) |
| *H01L 29/423* | (2006.01) |
| *H01L 29/20* | (2006.01) |

(52) U.S. Cl.
CPC ........ *H01L 21/283* (2013.01); *H01L 21/0254* (2013.01); *H01L 21/31116* (2013.01); *H01L 21/31144* (2013.01); *H01L 29/42316* (2013.01); *H01L 29/66462* (2013.01); *H01L 21/0217* (2013.01); *H01L 21/02274* (2013.01); *H01L 29/2003* (2013.01)

(58) Field of Classification Search
CPC ............... H01L 21/283; H01L 21/0254; H01L 21/31144; H01L 21/31116; H01L 29/66462; H01L 29/42316; H01L 21/0217; H01L 29/2003; H01L 21/02274; H01L 21/0273; H01L 21/31138; H01L 29/7787; H01L 29/41766; H01L 21/0274; H01L 21/28008
See application file for complete search history.

(56) References Cited

U.S. PATENT DOCUMENTS

2012/0205670 A1* 8/2012 Kudou ................ H01L 21/0465
257/77

FOREIGN PATENT DOCUMENTS

| JP | 09-293736 | 11/1997 |
|---|---|---|
| JP | 2005-251835 | 9/2005 |

* cited by examiner

*Primary Examiner* — Selim U Ahmed
(74) *Attorney, Agent, or Firm* — Smith, Gambrell & Russell, LLP.

(57) ABSTRACT

A process of forming a gate electrode in an electrode device is disclosed. The process includes steps of, depositing an insulating film on a nitride semiconductor layer; forming a photoresist with an opening corresponding to the gate electrode on the insulating film; forming a recess in the insulating film using the photoresist as an etching mask, the recess leaving a rest portion in the insulating film; exposing the photoresist in oxygen plasma; baking the photoresist to make an edge of the opening thereof dull; etching the rest portion of the insulating film using the dulled photoresist as an etching mask; and forming the gate electrode so as to be in contact with the semiconductor layer through the opening in the insulating film.

11 Claims, 10 Drawing Sheets

PROCESS OF FORMING ELECTRON DEVICE HAVING GATE ELECTRODE

CROSS REFERENCE TO RELATED APPLICATION

The present application is based on and claims the benefit of priority of Japanese Patent Application No. 2017-181482, filed on Sep. 21, 2017, the entire content of which is incorporated herein by reference.

TECHNICAL FIELD

1. Field of Invention

The present invention relates to a process of forming an electron device having a gate electrode, in particular, the invention relates to a process of forming a high electron mobility transistor (HEMT).

BACKGROUND

2. Related Background Arts

A Japanese Patent Application laid open No. JP-2005-251835A has disclosed a method for forming a gate electrode of a field effect transistor (FET). The method disclosed therein first forms a first patterned photoresist with an opening then deposits a first metal within the opening and on the photoresist. Thereafter, the method forms a second patterned photoresist with an opening on the first metal, where the opening in the second photoresist fully exposes the opening in the first photoresist. Finally, filling the opening in the second photoresist with a second metal by selective electro-plating using the first metal as a seed metal, the process may form a gate electrode with a T-shaped cross section after sequentially removing the second photoresist, the first metal exposed from the second metal, and the first patterned photoresist.

Another Japanese Patent laid open No. JP-H09-293736A has disclosed a process of forming a semiconductor device. The process disclosed therein first forms a dummy gate on a semiconductor substrate, then deposits a photoresist around the dummy gate and performs a hard baking for the photoresist. Finally, removing the dummy gate, depositing a gate metal, and removing the photoresists, a gate electrode with a cross section moderately expanding from a root thereof accompanying with an overhung may be obtained. Such a gate electrode may reduce parasitic capacitance inherently induced between a top of the gate electrode and a semiconductor layer on which the gate electrode is disposed.

A gate electrode of an FET is conventionally formed by first forming an opening in an insulating film that covers a whole surface of a semiconductor layer on which the gate electrode is to be formed, then a gate metal is deposited on the insulating film so as to fully fill the opening. In order to make the gate electrode securely in contact with the semiconductor layer, the opening formed in the insulating film preferably has a cross section gradually expanding from a bottom, namely, a surface of the semiconductor layer. Such an opening in the insulating film, where the opening has a cross section gradually expanding, may be conventionally formed by performing a hard baking for a photoresist and subsequent etching of the insulating film with the baked photoresist as an etching mask. However, a hard baking of a photoresist sometimes narrows the opening patterned in the photoresist, which makes a gate length of an FET unstable because the gate length is severely depending on a width of the opening in the photoresist.

SUMMARY

An aspect of the present invention relates to a process of forming an electron device that provides a gate electrode. The process of the invention comprises steps of: (a) depositing an insulating film that covers a semiconductor stack including semiconductor layers that are epitaxially grown on a substrate, the insulating film having an original thickness; (b) forming a photoresist on the insulating film, the photoresist providing an opening defined by an edge thereof, the opening corresponding to the gate electrode; (c) forming a recess in the insulating film by partially etching the insulating film using the photoresist as an etching mask, the recess leaving a rest portion of the insulating film thereunder; (d) exposing the photoresist in oxygen plasma to retreat the edge of the opening in the photoresist; (e) baking the photoresist to make the edge dull; (f) etching the rest portion of the insulating film so as to form an opening in the insulating film using the photoresist as the etching mask, the semiconductor stack exposing a surface thereof within the opening in the insulating film; and (g) forming the gate electrode so as to be in contact with the surface of the semiconductor stack through the opening in the insulating film.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, embodiment according to the present invention will be described referring to accompanying drawings. However, the invention is not restricted to the embodiment and has a scope defined in claims and equivalent thereto including all changes and modifications thereof. In the description of the drawings, numerals or symbols same with or similar to each other will refer to elements same with or similar to each other without duplicating explanations.

Figure 1:
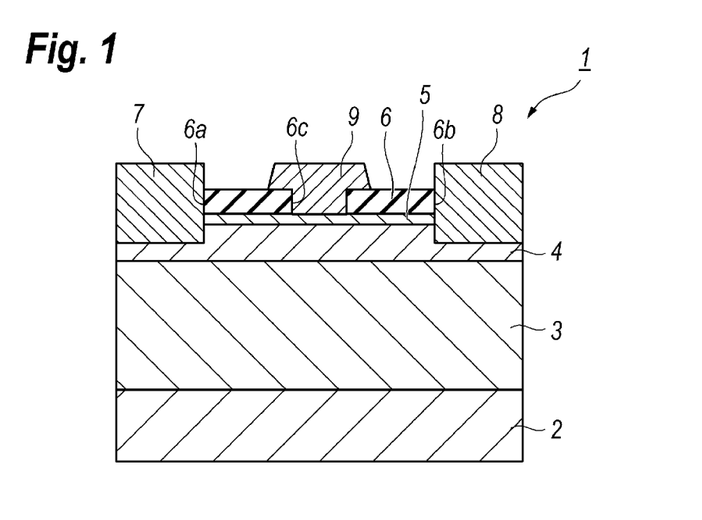
FIG. 1 is a cross sectional view of a field effect transistor (FET) formed by a process according to embodiment of the present invention.

FIG. 1 is a cross sectional view of a field effect transistor (FET) formed by a process according to the present invention. As shown in FIG. 1, the FET 1 includes a substrate 2, a channel layer 3, a barrier layer 4, a cap layer 5, an insulating film 6, and electrodes of a source 7, a drain 8, and a gate 9. The FET 1 shown in FIG. 1 has a type of, what is called, high electron mobility transistor (HEMT) that induces a two dimensional electron gas (2DEG) in the channel layer 3 at an interface against the barrier layer 4. The 2DEG becomes a channel for transporting carriers, namely, electrons.

The substrate 2, which is provided for epitaxially growing semiconductor layers thereon, may be made of silicon (Si), silicon carbide (SiC), sapphire ($Al_2O_3$), diamond (C) and the like. The HEMT 1 of the present embodiment provides the substrate 2 made of SiC. The channel layer 3, which is a layer epitaxially grown on the substrate 2, builds the channel formed by the 2DEG, as described above, may be made of nitride semiconductor material, for instance, gallium nitride (GaN) with a thickness greater than 200 nm but preferably less than 2 μm.

The barrier layer 4, which is a layer epitaxially grown on the channel layer 3, may be made of semiconductor material having electron affinity greater than that of the channel layer 3; that is, the barrier layer 4 has a conduction band with a level higher than that of the channel layer 3. The barrier layer 4 may be made of one of aluminum gallium nitride (AlGaN), indium aluminum nitride (InAlN), and indium aluminum gallium nitride (InAlGaN). The barrier layer 4 may be intentionally doped with n-type dopants. The HEMT 1 of the present embodiment provides the barrier layer 4 made of n-type AlGaN with a thickness greater than 5 nm but preferably less than 30 nm. The cap layer 5, which is a layer epitaxially grown on the barrier layer 4, may be made of nitride semiconductor material, typically GaN. The HEMT 1 of the present embodiment provides the cap layer 5 made of n-type GaN with a thickness greater than 1 nm but preferably less than 5 nm.

The insulating film 6, which is deposited on the cap layer 5, may be made of inorganic material, typically silicon nitride (SiN). The insulating film 6 provides openings, 6a to 6c, where the cap layer 5 is removed in the openings, 6a and 6b, to expose the barrier layer 4 therein; but the rest opening 6c exposes the cap layer 5 therein. The former two openings, 6a and 6b, correspond to the source electrode 7 and the drain electrode 8; while, the latter opening 6c corresponds to the gate electrode 9.

Specifically, the source and drain electrodes, 7 and 8, are in contact with the barrier layer 4 through the respective openings, 6a and 6b. The source and drain electrodes, 7 and 8, which are, what is called, ohmic electrodes, may be formed by alloying stacked metals of titanium (Ti) and aluminum (Al). The stacked metals may further include another Ti on Al. The stacked metals may be alloyed at a temperature higher than 500° C. In an alternative, Ti may be replaced to tantalum (Ta).

The gate electrode 9 is in contact with the cap layer 5 and the insulating film 6. Specifically, the gate electrode 9 is in contact with the cap layer 5 in the opening 6c; while extends on the insulating film 6 around the opening 6c. The gate electrode 9, which is put between the source and drain electrodes, 7 and 8, may be made of stacked metals of nickel (Ni), palladium (Pd), and gold (Au), where Ni is in contact with the cap layer 5 and forms a Schottky contact thereto. In an alternate, platinum (Pt) may be implemented in the gate electrode 9 substituting palladium (Pd).

Next, a process of forming the HEMT 1 according to the present invention will be described referring to FIG. 2A to FIG. 4, where those figures show steps of the process by respective cross sectional views of the HEMT 1.

Figure 2A:
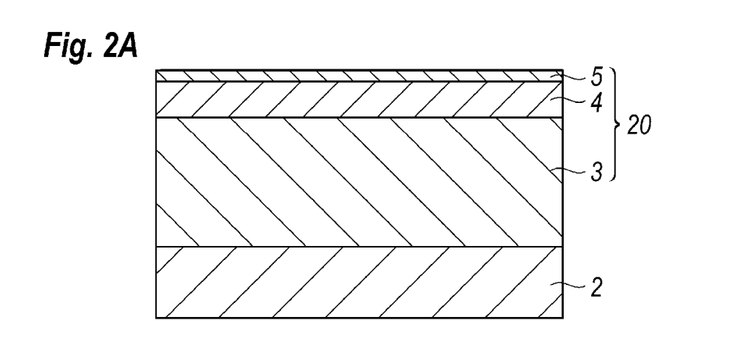
FIG. 2A to FIG. 2C show steps of the process of forming the FET by respective cross sectional views thereof.

First, the process epitaxially grows a semiconductor stack 20 on the substrate 2 as shown in FIG. 2A, where the semiconductor stack 20 includes the channel layer 3, the barrier layer 4 and the cap layer 5 from the substrate 2 in this order. The epitaxial growth may be carried out by the metal organic chemical vapor deposition (MOCVD) technique, which is very popular in a field of the semiconductor process. The MOCVD process may sequentially grow, on a substrate 2 of silicon carbide (SiC), a semiconductor layer made of gallium nitride (GaN) operable as the channel layer 3, a semiconductor layer made of aluminum gallium nitride (AlGaN) operable as the barrier layer 4, and a semiconductor layer with a thickness of, for instance, 5 nm and made of n-type GaN that is operable as the cap layer 5.

Figure 2B:
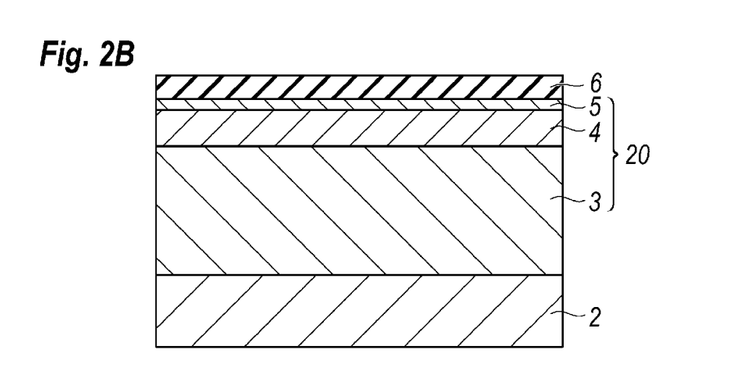

Thereafter, as shown in FIG. 2B, the process deposits an insulating film 6 so as to fully cover the cap layer 5. A plasma-assisted chemical vapor deposition (p-CVD) method may deposit the insulating film 6 using reactive sources of silane ($SiH_4$) for silicon (Si) and ammonia ($NH_3$) for nitrogen (N). In an alternative, a low pressure chemical vapor deposition (LPCVD) technique may be replaced to the p-CVD technique using di-chloro-silane ($SiH_2Cl_2$) for silicon (Si) and ammonia ($NH_3$) for nitrogen (N).

Figure 2C:
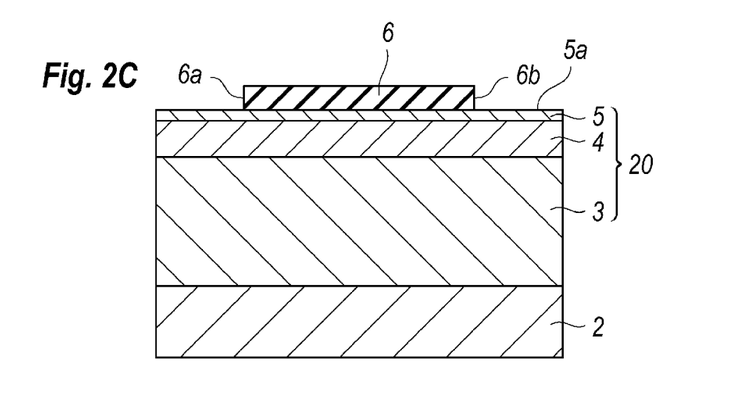
Figure 3A:
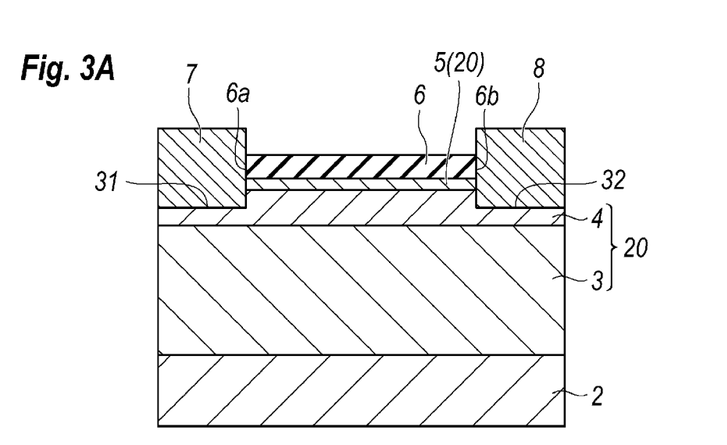
FIG. 3A to FIG. 3C show steps of the process of forming the FET by respective cross sectional views thereof, which are carried out subsequent to the step shown in FIG. 2C.

Thereafter, as shown in FIG. 2C, the insulating film 6 is partially etched so as to form the openings, 6a and 6b. Specifically, a photolithography forms a patterned photoresist and the reactive ion etching (RIE) subsequently carried out after the photolithography forms the openings, 6a and 6b, in the insulating film 6. The cap layer 5 may be exposed within the openings, 6a and 6b. The process may further etched the cap layer 5 and partially etches the barrier layer 4 within the openings, 6a and 6b, as shown in FIG. 3A. Thus, the process may form recesses, 31 and 32. Depositing stacked metals of titanium (Ti) and aluminum (Al) within the openings, 6a and 6b, so as to be in contact with the barrier layer 4; removing the photoresist; and alloying the stacked metals at a temperature higher than 500° C., the source electrode 7 and the drain electrode 8 are formed within the recesses, 31 and 32.

Figure 3B:
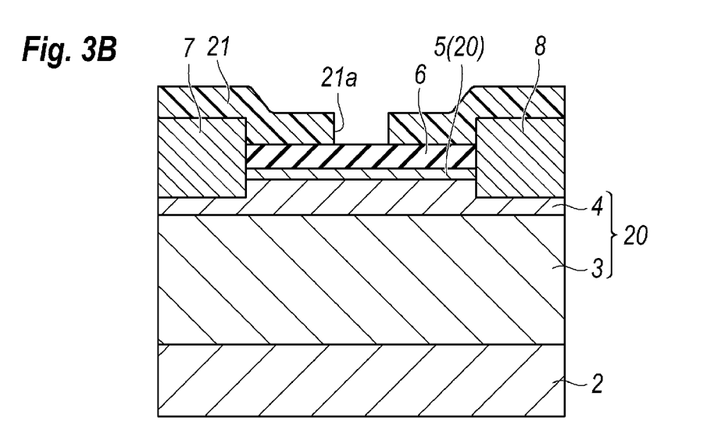

Thereafter, as shown in FIG. 3B, the photolithography may form another patterned photoresist 21 with an opening 21a on the insulating film 6. The patterned photoresist 21 is a type of, what is called, EB photoresist, and the opening 21a may be formed by the electron beam (EB) exposure.

Figure 3C:
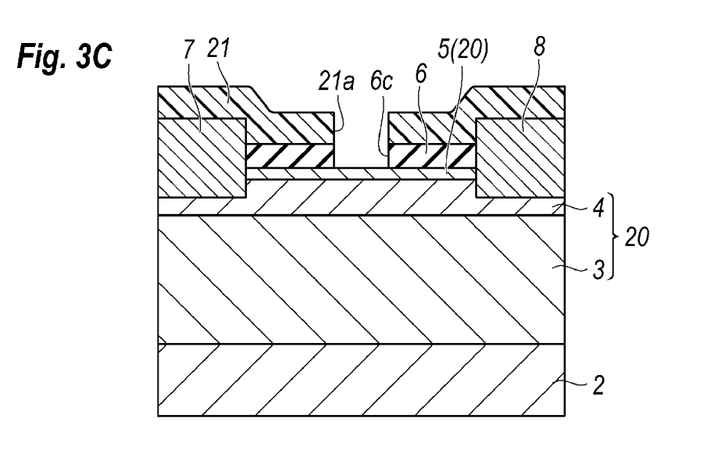

Thereafter, the process etches the insulating film 6 to form an opening 6c therein by the reactive ion etching (RIE) using a reactive gas source containing fluorine (F), such as sulfur hexafluoride ($SF_6$), tetra-fluoro-methane ($CF_4$), and so on. The present embodiment uses $SF_6$ as the etching gas source. Also, the process may use an inductive coupled plasma-reactive ion etching (ICP-RIE) as the RIE process. Conditions of the etching are those; an etching pressure of 1 Pa, power of a radio-frequency (RF) source of 100 to 500 W, and a bias of 10 to 30 W, respectively. The opening 6c in the insulating film 6 may expose a surface of the semiconductor stack 20, exactly, the surface of the cap layer 5.

Figure 4:
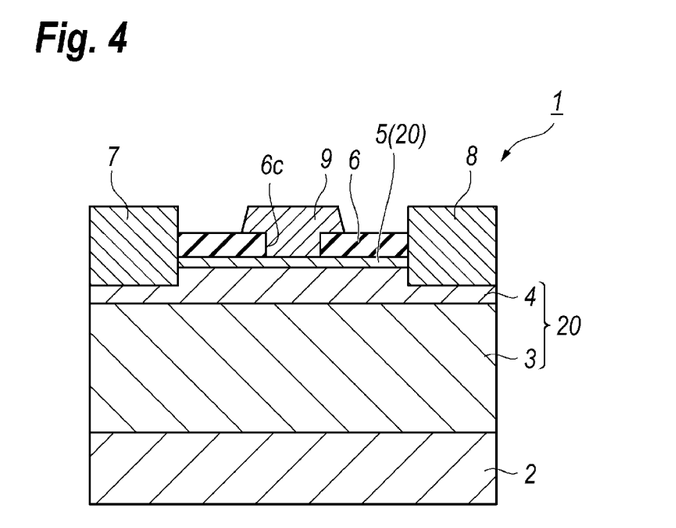
FIG. 4 shows a step of the process of forming the FET by a cross sectional view thereof, which is carried out subsequent to the step shown in FIG. 3C.

Thereafter, removing the EB photoresist 21, another patterned photoresist is formed on the insulating film 6. The patterned photoresist provides an opening that includes the opening 6c; that is, the opening in the photoresist fully overlaps with the opening 6c in the insulating film 6. Depositing metals within the opening in the photoresist so as to fill the opening 6c in the insulating film 6 and removing the patterned photoresist, the gate electrode 9 may be formed such that the gate electrode 9 is in direct contact with the cap layer 5 within the opening 6c and extends on the insulating film 6 in outer peripheries of the opening 6c, as shown in FIG. 4. Thus, the process of forming the FET 1 according to the present invention is completed.

Next, the steps of the process shown in FIG. 3B to FIG. 4 will be further explained referring to FIG. 5A to FIG. 10, where those figures explains the steps in detail.

Figure 5A:
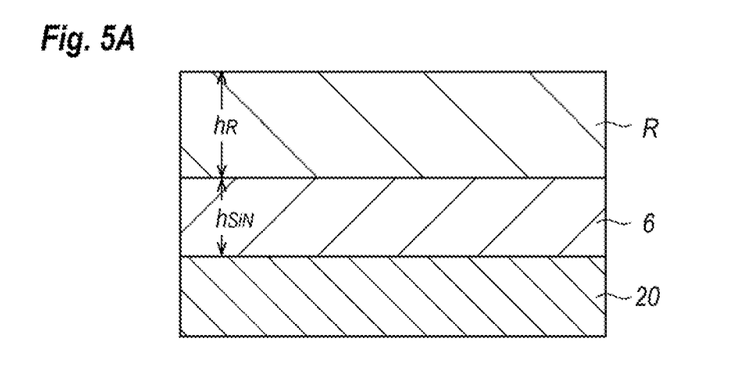
FIG. 5A to FIG. 5C specifically show steps of the process of forming the FET by respective cross sectional views thereof.

First, the step shown in FIG. 3B will be explained. As shown in FIG. 5A, a photolithography first coats the insulating film 6 that covers the semiconductor stack 20 with a photoresist R, where the insulating film 6 has a thickness $h_{SiN}$ of, for instance, at least 50 nm. When the photoresist R is a type of ultraviolet curable photoresist that contains primarily cresol novolac resin, novolac type phenolic resin, and so on; the photoresist R preferably has a thickness $h_R$ of 1 to 2 μm. On the other hand, when the photoresist R is a type of electron beam (EB) photoresist such as copolymer of methyl α-chloroacrylate and α-methyl-estyrene (ZEP520), poly methyl methacrylate (PMMA), or those containing fullerene, and so on; the photoresist R preferably has a thickness $h_R$ of 300 to 500 nm. The present embodiment uses an EB photoresist with a thickness of 400 nm. But, the thickness $h_R$ of the photoresist may be determined depending on a thickness $h_{SiN}$ of the insulating film 6.

The process may perform pre-baking for the photoresist R just after the coating at conditions of a temperature of 150 to 250° C. and a time of 1 to 20 minutes in a case where the photoresist is a type of EB photoresist. The present embodiment performs the pre-baking at 180° C. for 3 minutes.

Figure 5B:
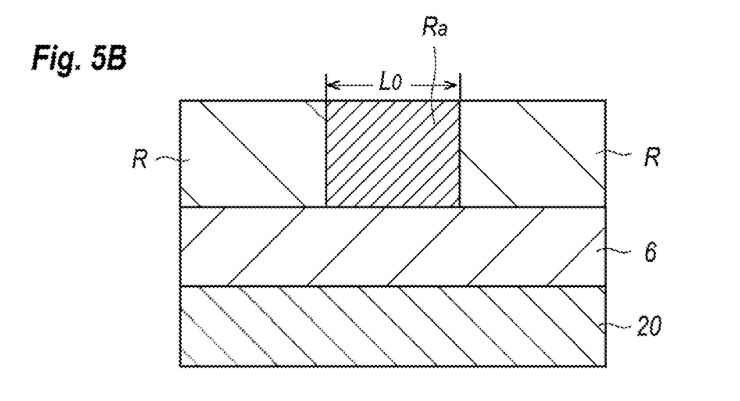

Thereafter, the exposure of the photoresist R is carried out. A portion of the photoresist R corresponding to an opening 6c to be formed in the insulating film 6 is exposed in electron beams to form an exposed portion Ra in the photoresist R with a width $L_0$ of, for instance, 50 nm for the EB exposure but 400 nm for the UV exposure. The width $L_0$ may be determined by a minimum width $L_4$ set for the opening 6c in the insulating film 6, which will be described later in FIG. 7A. The EB exposure may set dosage of, for instance, 500 μC/cm².

Figure 5C:
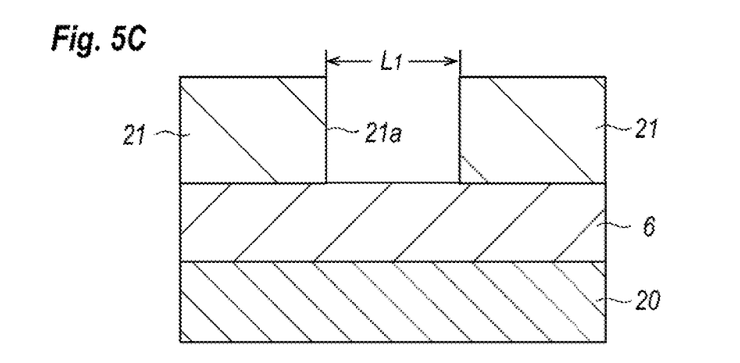

Thereafter, development for the photoresist R is carried out to remove an exposed portion $R_a$, which finally forms a patterned photoresist 21 with an opening 21a is left on the insulating film 6. The opening 21a has a width $L_1$ of, for instance, 60 nm that is slightly greater than the width $L_0$ described above. A mixture of methyl isobutyl ketone (MIBK), methyl ethyl ketone (MEK), xylene, n-amyl acetate, and/or isopropanol (IPA) may be used as a developer. The embodiment uses a mixture of MIBK and IPA with a ratio of 89:11 as the developer.

Figure 6A:
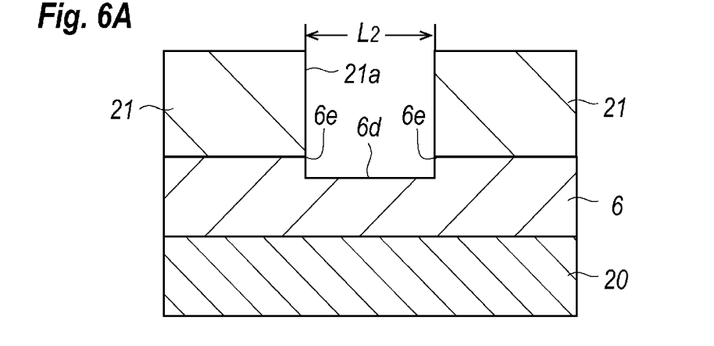
FIG. 6A to FIG. 6C specifically show steps of the process of forming the FET by respective cross sectional views thereof, which are carried out after the step shown in FIG. 5C.

Thereafter, as shown in FIG. 6A, the insulating film 6 is partially etched using the patterned photoresist 21 as an etching mask to form a recess in the insulating film 6. A reactive ion etching (RIE) may be used to etch the insulating film 6. The recess, which may provide a bottom 6d and sides 6e, has a depth preferably greater than 5 nm but shallower than 10 nm, which is about 20% of the total thickness of the insulating film 6. The etching may also widen the opening 21a slightly; specifically, the opening 21a has the width $L_3$ of, for instance, 70 nm after the etching because the RIE process usually accompanies a side etching.

The RIE process for partially etching the insulating film 6 may be carried out using reactive gas containing fluorine, such as sulfur hexa-fluoride ($SF_6$), carbon tetra-fluoride ($CF_4$), tri-fluoro-methane ($CHF_3$), hexa-fluoro-propylene ($C_3F_6$), hexa-fluoro-ethane ($C_2F_6$), and so on. Another reactive gas containing chlorine (Cl) may etch the insulating film 6 of a type of silicon nitride (SiN). The RIE process carried out under those conditions may show an etching rate of 0.1 to 0.3 nm/sec and an etching time may be determined as a time necessary to etch an insulating film whose thickness is increased by 5 to 15% from that of the insulating film 6 subtracting a time necessary to etch a rest portion of the insulating film 6 left under the recess. Practically, the present embodiment sets the etching time longer than 10 seconds for the reactive gas containing fluorine (F), while the etching time is set to be 20 to 1200 seconds for an etching gas containing chlorine (Cl). An etching pressure is set to be 0.1 to 10 Pa, an RF bias is set to be 20 to 500 W, and an ICP bias is set to be 0 to 50 W. Those conditions are for the ICP-RIE, but the process of the present invention may use another type of RIE, such as capacitor coupled plasma etching (CCP).

Figure 6B:
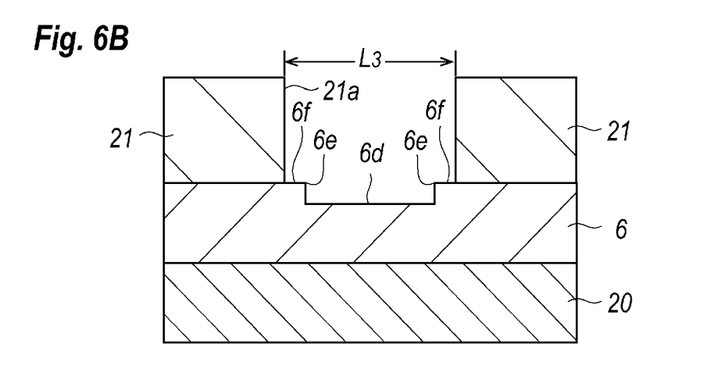

Thereafter, the patterned photoresist 21 is exposed in oxygen plasma. The RIE process for forming the recess possibly modifies a surface of the photoresist 21, the process of exposing in the oxygen plasma may remove those modified portion of the photoresist 21. The exposure within the oxygen plasma may remove the surface of the photoresist 21 by at least 5 nm. The oxygen plasma process above described also widens the opening 21a as shown in FIG. 6B. The process of exposing the oxygen plasma widens the opening 21a by at least 5 nm; then, the opening 21a has a width $L_3$ of, for instance, 70 nm, which exposes the surface 6f of the insulating film 6 within the opening 21a in the patterned photoresist 21.

The process of exposing the oxygen plasma may use, for instance, a plasma etching apparatus with a barrel type, or, a parallel plate type; and a source gas of oxygen ($O_2$) or ozone ($O_3$). The gas pressure of 5 to 200 Pa, the RF power of 50 to 500 W, and a process time of 10 to 600 seconds are applicable to the exposure process. The present embodiment sets the gas pressure of 50 Pa, the RF power of 300 W, and the process time of 30 seconds.

Thereafter, the photoresist 21 is baked at a temperature of 140 to 250° C. for a period of 5 to 60 minutes. The embodiment bakes the photoresist 21 at a temperature of 180° C. for 15 minutes. The period of the baking is preferably longer than a period of pre-baking by about 10 minutes.

Figure 6C:
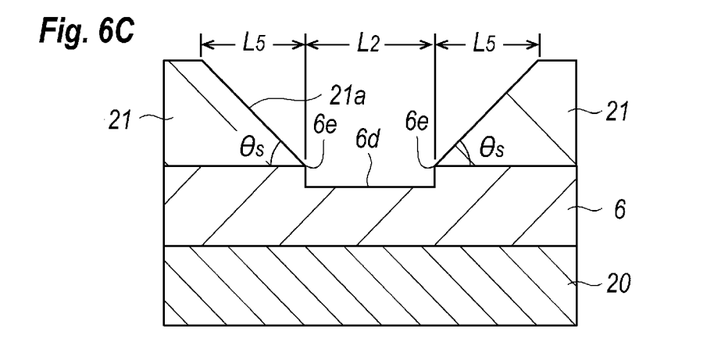

The baking may softens the photoresist 21 to make edges of the opening 21 dull as shown in FIG. 6C, which means that an opening attributed to the opening 21a becomes greater as being apart from the insulating film 6, and shifts roots thereof to the edges 6e of the recess in the insulating film 6. That is, the opening 21a in the photoresist 21 becomes narrower at the root thereof but widens as being apart from the root. However, because the recess in the insulating film 6 has the edges 6e at the surface thereof, the root of the opening 21a in the photoresist 21 is unable to exceed the edges 6e within the recess because of the surface tension. Thus, the recess in the insulating film 6 becomes free from the photoresist 21 as shown in FIG. 6C.

The opening 21a has a width $L_5$ in the dulled portions to be about 700 nm, which means that the photoresist 21 has an angle $\theta_S$ in the dulled portion to be about 30°. This angle may be determined by a thickness $h_R$ of the photoresist R taking a reduction thereof during the exposure in the oxygen plasma and the baking temperature of the photoresist R. As the thickness $h_R$ of the photoresist R becomes thinner, the angle $\theta_S$ in the dulled portion becomes smaller. Also, as the baking temperature becomes higher, the angle $\theta_S$ becomes smaller.

Figure 7A:
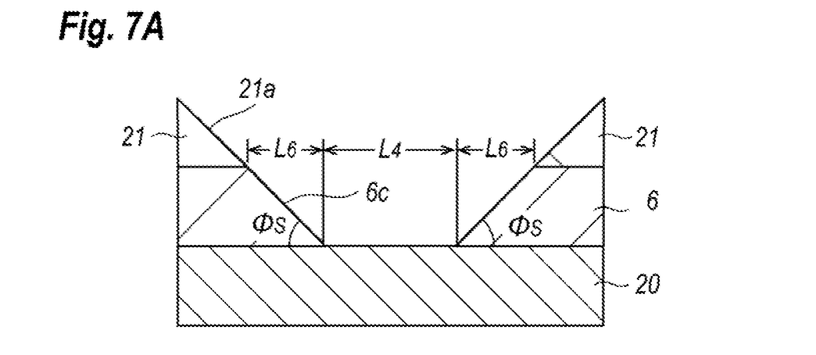
FIG. 7A and FIG. 7B specifically show steps of the process of forming the FET by respective cross sectional views thereof, which are carried out after the step shown in FIG. 6C.

Next, the step of the process shown in FIG. 3C will be described in detail. After the bake of the photoresist 21, the process etches the insulating film 6 again. Specifically, a rest portion under the recess of the insulating film 6 is etched, which forms an opening 6c in the insulating film 6 as shown in FIG. 7A and the surface of the semiconductor stack 20 is exposed within the opening 6c. The opening 6c in a cross section thereof becomes that shown in FIG. 7A; that is, the cross section of the opening 6c reflects the dulled portion in the photoresist 21, where the opening 6c causes an inclined side with an expanded width thereof as being apart from the bottom. The shape of the opening 6c in the cross section thereof depends on the angle $\theta_S$ in the baked photoresist 21 and a ratio of the etching rate for the baked photoresist 21 against that of the insulating film 6. The etching time may be substantially same with that for etching the insulating film 6 without the recess, namely, the insulating film having the thickness $h_{SiN}$ or slightly greater. Other conditions of etching the insulating film 6 are same with those for forming the recess in the insulating film 6.

Figure 7B:
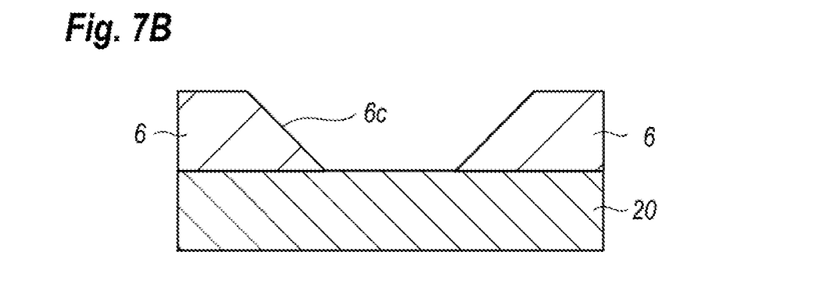

The present embodiment forms the cross section of the opening 6c with a width $L_4$ of 100 nm at the bottom thereof in case of an EB photoresist, and a width $L_6$ of the inclines sides of, for instance, 70 nm, and an angle $\varphi_S$ with respect to the horizontal line, namely, the plane surface of the semiconductor stack 20 is around 30°. After the etching, the photoresist 21 is removed to leave the insulating film 6 with the opening 6c for the gate electrode as shown in FIG. 7B. The photoresist 21 may be removed by soaking the substrate 2 within a pyrrolidon at a temperature of 90° C. for about one hour.

Figure 8A:
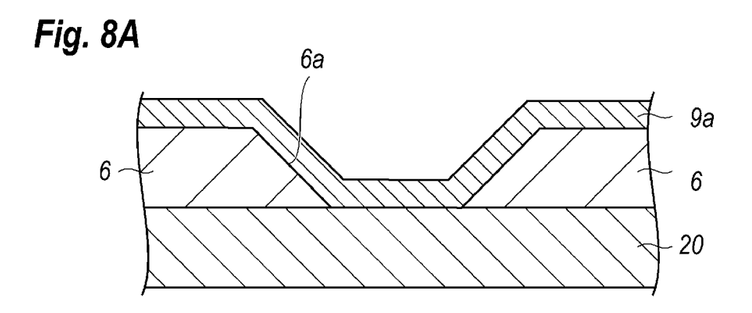
FIG. 8A and FIG. 8B specifically show steps of the process of forming the FET by respective cross sectional views thereof, which are carried out after the step shown in FIG. 7B.
Figure 8B:
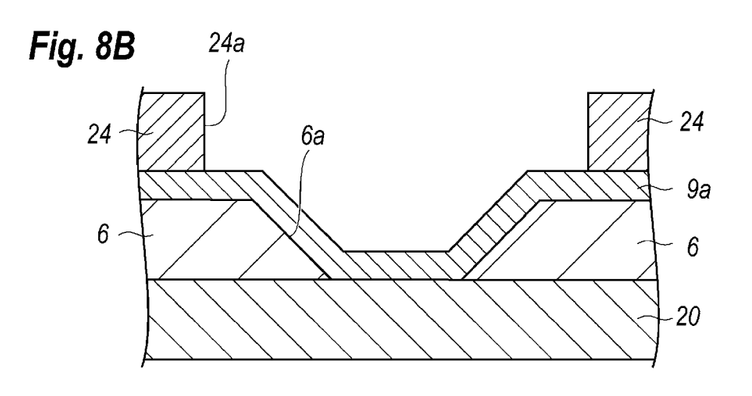

Next, the step shown in FIG. 4 will be described in detail. The process first covers the insulating film 6 and the surface of the semiconductor stack 20 exposed within the opening 6c with a metal film 9a as shown in FIG. 8A. Then, another photoresist 24 is formed on the metal film 9a, where the photoresist 24 provides an opening 24a that fully covers and overlaps with the opening 6c in the insulating film 6, as shown in FIG. 8B.

Figure 9A:
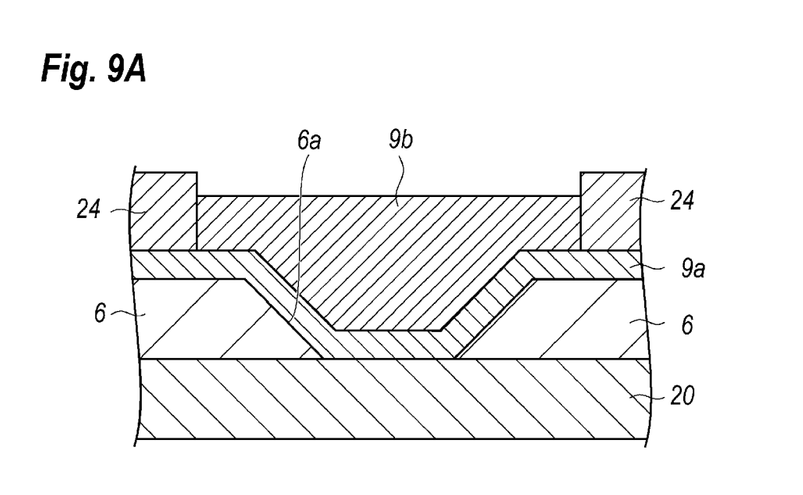
FIG. 9A and FIG. 9B specifically show steps of the process of forming the FET by respective cross sectional views thereof, which are carried out after the step shown in FIG. 8B.
Figure 9B:
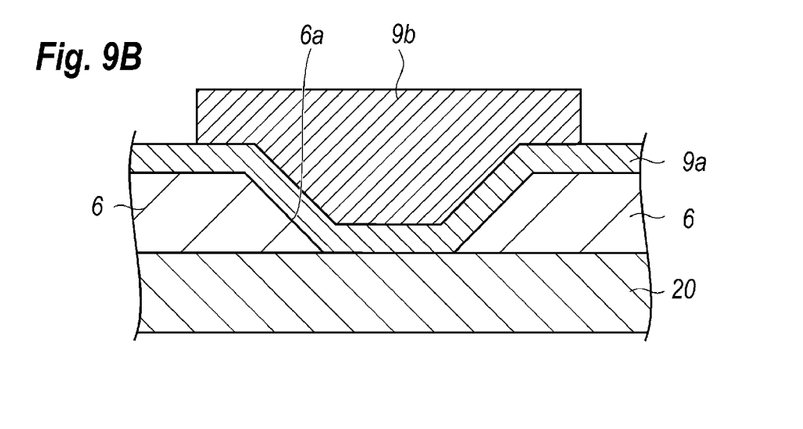
Figure 10:
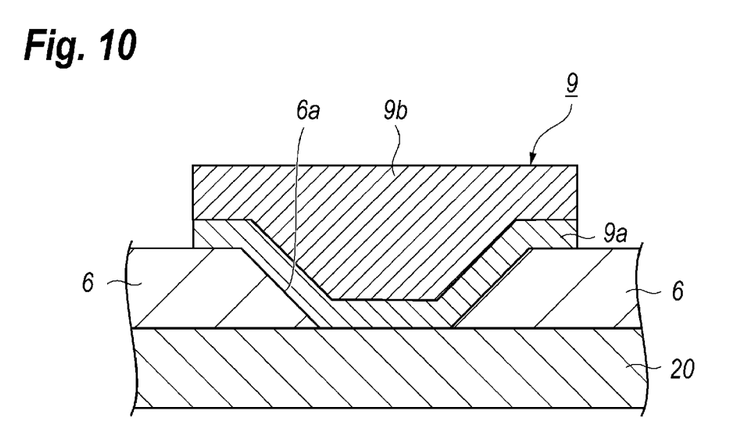
FIG. 10 specifically shows a step of the process of forming the FET by a cross sectional view thereof, which is carried out after the step shown in FIG. 9B.

Thereafter, another metal 9b, which may be made of gold (Au), buries the opening 24c by electrolytic plating using the former metal film 9a as a seed metal. Removing the patterned photoresist 24, the stacked metals, 9a and 9b, are left on the insulating film 6, as shown in FIG. 9B. Finally, removing the metal film 9a exposed in respective sides of the latter metal 9b on the insulating film 6 is removed, as shown in FIG. 10. Thus, the gate electrode 9 is formed such that the width thereof becomes $L_4$ at the surface of the semiconductor stack 20, gradually widens as apart from the surface by a rate determined by the angle $\varphi_S$ against the surface of the semiconductor stack 20, and finally becomes a width solely determined by the second photoresist 24 on the insulating film 6.

Advantages of the process according to the present invention will be described. The process of the present invention, as shown in FIG. 6A, first forms the recess using the photoresist 21 with the opening 21a. The recess, in particular, the edge 6e thereof may effectively prevent the photoresist 21 from spreading within the recess at the subsequent step of baking the photoresist 21, which may precisely determine, or keep the width of the bottom of the opening 21a substantially same with the width $L_2$ of the bottom of the photoresist 21 before the baking even if the photoresist 21 is hard-baked. Thus, the overlapping length between the gate electrode 9 and the surface of the semiconductor stack 20, namely, the gate length of the FET 1, may be precisely and stably determined.

The process according to the present invention slightly widens the width of the opening 21a formed in the patterned photoresist 21, specifically, at least 5 nm in respective sides thereof, by exposing the photoresist within the oxygen plasma, which may leave an enough room for the photoresist for making the sides of the opening 21a dull. The recess thus formed in the insulating film 6 may have a depth of at least 5 nm, which may securely prevent the photoresist 21 from spreading within the recess.

The processing time for forming the recess may be a time necessary to etch an insulating film 6 with a thickness greater than that $h_{SiN}$ of the present embodiment by 5 to 15% subtracting an etching time necessary to etch a rest portion of the insulating film 6 left under the recess. Thus, the recess may have a substantial depth to securely form the edge 6e.

The rest portion of the insulating film 6 left under the recess may be etched by the RIE process whose etching time is preferably longer than an etching time necessary to etch the insulating film 6 without any recesses. Thus, the dulled side of the opening 21a in the photoresist 21 may be securely reflected in the sides of the opening 6c in the insulating film 6.

In the foregoing detailed description, the process of the present invention has been described with reference to specific exemplary embodiment thereof. However, it will be apparent that various modifications and changes may be made thereto without departing from the broader spirit and scope of the present invention. For instance, the embodiment concentrates on the process for forming a HEMT, but the process of the invention may be applicable to other types of electron devices. Accordingly, the present specification and figures are to be regarded as illustrative rather than restrictive.

What is claimed is:

1. A process of forming an electron device that provides a gate electrode, the process comprising steps of:
    depositing an insulating film that covers a semiconductor stack including semiconductor layers that are epitaxially grown on a substrate, the insulating film having an original thickness;
    forming a photoresist on the insulating film, the photoresist providing an opening defined by an edge thereof, the opening corresponding to the gate electrode;
    forming a recess in the insulating film by partially etching the insulating film using the photoresist as an etching mask, the recess leaving a rest portion of the insulating film thereunder;
    exposing the photoresist in oxygen plasma to retreat the edge of the opening in the photoresist;
    baking the photoresist to make the edge dull;
    etching the rest portion of the insulating film so as to form an opening in the insulating film using the photoresist as the etching mask, the semiconductor stack exposing a surface thereof within the opening in the insulating film; and forming the gate electrode so as to be in contact with the surface of the semiconductor stack within the opening of the insulating film.

2. The process according to claim 1,
wherein the step of exposing the photoresist in the oxygen plasma retreats the edge of the opening in the photoresist at least 5 nm.

3. The process according to claim 1,
wherein the step of forming the recess includes a step of etching the insulating film by at least 5 nm but at most 20% of the original thickness of the insulating film.

4. The process according to claim 1,
wherein the step of forming the recess takes a time for fully etching an insulating film with a thickness 5 to 15% greater than the original thickness subtracting a time for fully etching the rest portion of the insulating film under the recess.

5. The process according to claim 1,
wherein the step of etching the rest portion of the insulating film takes an etching time that is substantially equal to a time for etching an insulating film with the original thickness.

6. The process according to claim 1,
wherein the photoresist is a type of an electron beam (EB) photoresist having a thickness of 300 to 500 nm.

7. The process according to claim 1,
wherein the photoresist is a type of ultraviolet curable photoresist with a thickness of 1 to 2 μm.

8. The process according to claim 1,
wherein the step of baking the photoresist is carried out at a temperature of 140 to 250° C. for 5 to 60 minutes.

9. The process according to claim 1,
wherein the step of forming the recess retreats an edge of the opening.

10. The process according to claim 1,
wherein the step of depositing the insulating film includes a step of depositing a silicon nitride (SiN) with a thickness at least 50 nm by a low pressure chemical vapor deposition (LPCVD) technique.

11. The process according to claim 1,
wherein the step of forming the gate electrode includes a step of depositing stacked metals of nickel (Ni) and gold (Au), where Ni is in contact with the semiconductor stack.

* * * * *